(12) United States Patent
Hsieh et al.

(10) Patent No.: US 8,383,299 B2
(45) Date of Patent: Feb. 26, 2013

(54) DOUBLE PATTERNING MASK SET AND METHOD OF FORMING THEREOF

(75) Inventors: Te-Hsien Hsieh, Kaohsiung (TW); Ming-Jui Chen, Tainan (TW); Shih-Ming Kuo, Tainan (TW); Ping-I Hsieh, Tainan (TW); Cheng-Te Wang, Hsinchu County (TW); Jing-Yi Lee, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 164 days.

(21) Appl. No.: 13/109,006

(22) Filed: May 17, 2011

(65) Prior Publication Data

US 2012/0295186 A1   Nov. 22, 2012

(51) Int. Cl.
*G03F 1/36* (2012.01)
(52) U.S. Cl. .......................................................... 430/5
(58) Field of Classification Search ................ 430/5, 30, 430/322, 394
See application file for complete search history.

(56) References Cited

U.S. PATENT DOCUMENTS 6,033,811 A    3/2000   Lee

*Primary Examiner* — Stephen Rosasco
(74) *Attorney, Agent, or Firm* — Winston Hsu; Scott Margo

(57) ABSTRACT

A double patterning mask set includes a first mask having a first set of via patterns, and a second mask having a second set of via patterns. The first set of via patterns includes at least two via patterns arranged along a diagonal direction, each of the at least two via patterns has at least a truncated corner. The first set of via patterns and the second set of via patterns are interlacedly arranged along a horizontal direction and a vertical direction.

10 Claims, 4 Drawing Sheets

DOUBLE PATTERNING MASK SET AND METHOD OF FORMING THEREOF

BACKGROUND OF THE INVENTION

1. Field of the Invention

The present invention relates to via patterns of a double patterning mask set, and more particularly, to via patterns of a double patterning mask set having truncated corners.

2. Description of the Prior Art

Mask design is a necessary and important step during design and manufacturing processes of an integrated circuit. In the step of mask design, a corresponding via pattern array is generated according to circuit design of the integrated circuit. The via pattern array is then formed on a mask for exposing a wafer in the manufacturing processes of the integrated circuit. However, scale of the manufacturing processes of the integrated circuit is getting smaller, and wavelength of light of current exposure machines is limited, so if the via patterns on the mask are too close to each other, the patterns developed on the wafer may be incorrect due to light interference, such that the integrated circuit fails.

SUMMARY OF THE INVENTION

The present invention provides a double patterning mask set comprising a first mask having a first set of via patterns, and a second mask having a second set of via patterns. The first set of via patterns includes at least two via patterns arranged along a diagonal direction, each of the at least two via patterns has at least a truncated corner. The first set of via patterns and the second set of via patterns are interlacedly arranged along a horizontal direction and a vertical direction.

The present invention further provides a method for forming semiconductors on a wafer by utilizing a double patterning mask set. The method comprises providing a double patterning mask set having a first mask with a first set of via patterns and a second mask with a second set of via patterns, the first set of via patterns and the second set of via patterns interlacedly arranged along a horizontal direction and a vertical direction, and at least one of the sets of via patterns comprising a via pattern with a truncated corner; utilizing the first mask to expose the wafer; and utilizing the second mask to expose the wafer.

The present invention further provides a method for forming a double patterning mask set. The method comprises generating a via pattern array; dividing the via pattern array into a first set of via patterns and a second set of via patterns, wherein the first set of via patterns and the second set of via patterns are interlacedly arranged along a horizontal direction and a vertical direction, and are complementary to each other to form the via pattern array; modifying the first set of via patterns and the second set of via patterns to form at least a truncated corner on at least a via pattern; and forming the modified first set of via patterns on a first mask, and forming the modified second set of via patterns on a second mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
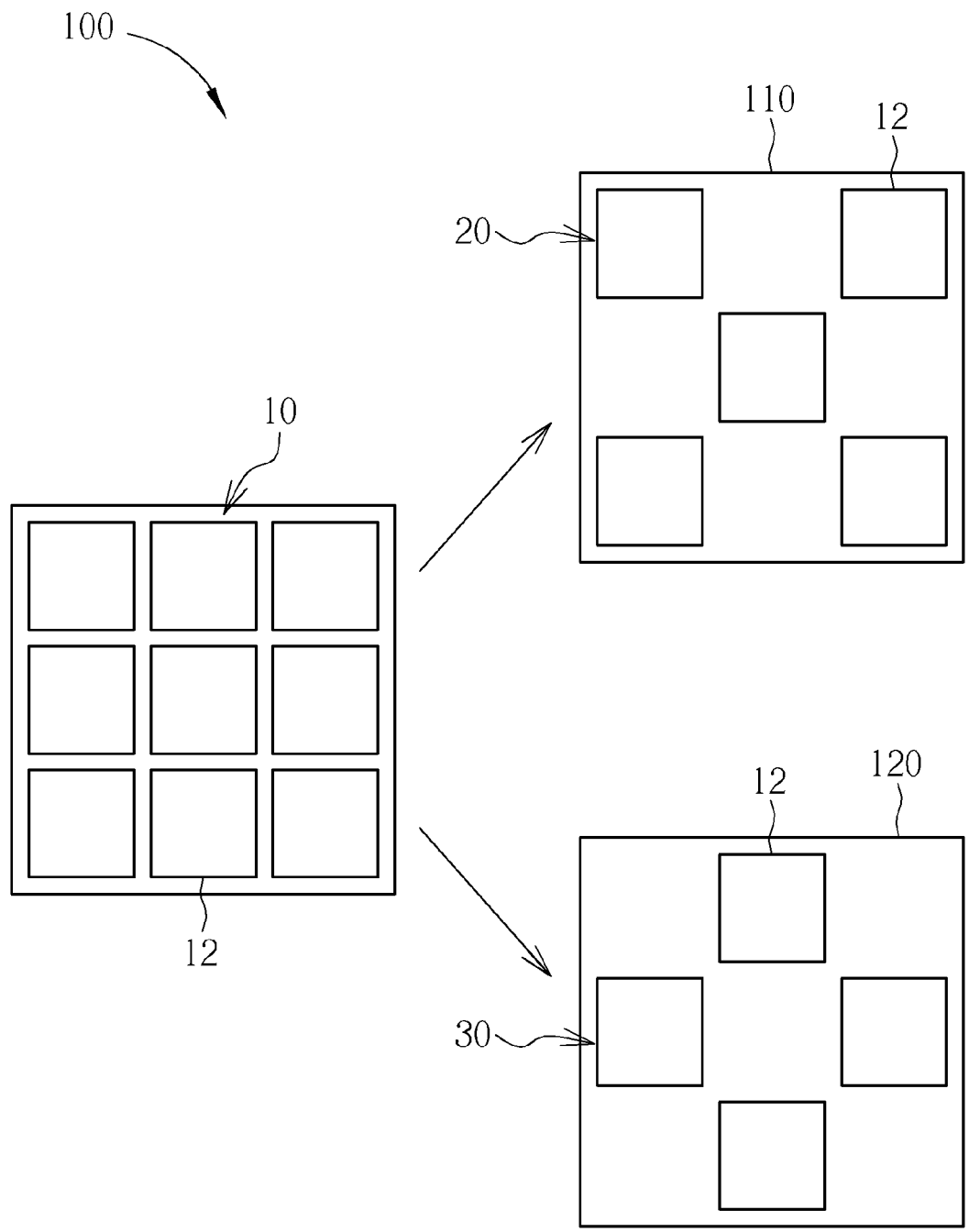
FIG. 1 is a diagram showing a double patterning mask.
Figure 2:
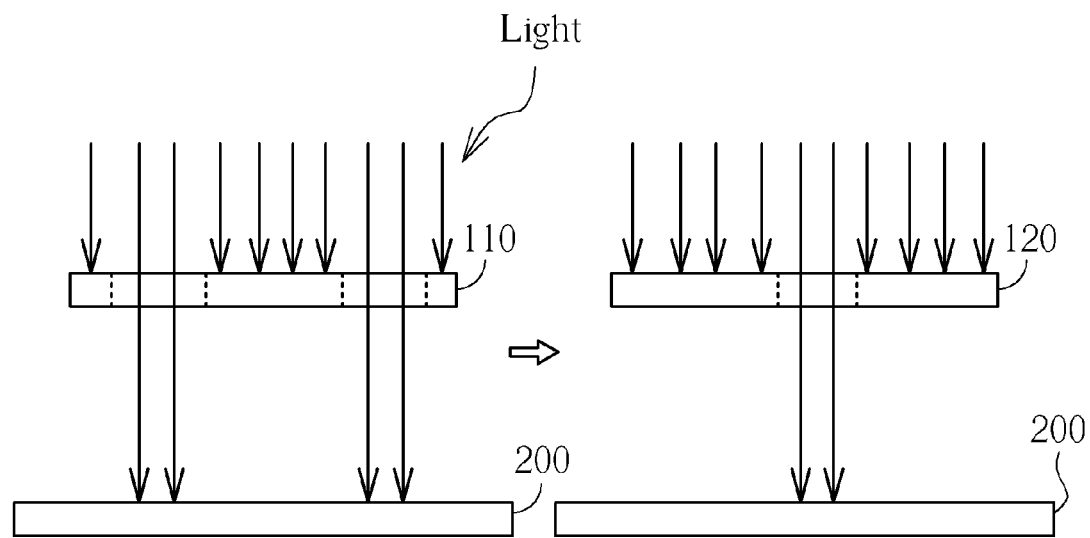
FIG. 2 is a diagram showing a wafer being exposed by utilizing the double patterning mask of FIG. 1.

Please refer to FIG. 1 and FIG. 2. FIG. 1 is a diagram showing a double patterning mask 100. FIG. 2 is a diagram showing a wafer 200 exposed by utilizing the double patterning mask set 100 of FIG. 1. In order to solve the problem of incorrectly developed patterns on the wafer caused by light interference due to insufficient gap between via patterns, the present invention utilizes a double patterning technique, which generates a via pattern array according a layout of a wafer 200 in a computer system, and then divides the via pattern array into two sets of via patterns for formation on a pair of masks 100, respectively. For example, in a preferred embodiment, the via pattern array 10 is divided into a first set of via patterns 20 and a second set of via patterns 30, wherein the first set of via patterns 20 and the second set of via patterns 30 are interlacedly arranged along a horizontal direction and a vertical direction, and are complementary to each other to form the via pattern array 10. The first set of via patterns 20 is formed on a first mask 110, and the second set of via patterns 30 is formed on a second mask 120. The wafer is then exposed by utilizing the first mask 110 and the second mask 120 respectively in order to prevent light interference due to an insufficient gap between via patterns 12. The double patterning technique of the present embodiment can make the current exposure machine useful for manufacturing integrated circuits at a smaller scale, and includes two exposures and one etch or two exposures and two etches. Shape of the via patterns is generally rectangular or another polygonal shape, and in the present embodiment, the via patterns are rectangular (or square).

Figure 3:
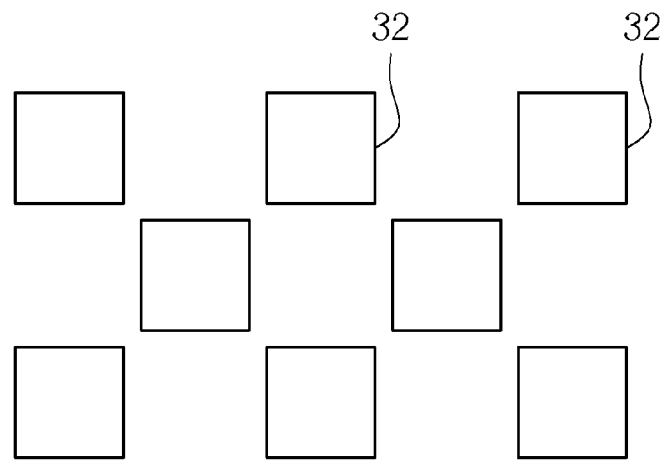
FIG. 3 is a diagram showing an arrangement of the via patterns of the double patterning technique.

Please refer to FIG. 3, which is a diagram showing an arrangement of the via patterns of the double patterning technique. As shown in FIG. 3, since the double patterning technique divides the via pattern array into two sets of via patterns, the via patterns 32 are spaced apart from each other to enlarge gaps between via patterns. However, light interference may still occur due to the corners of the via patterns 32 being too close to each other.

Figure 4:
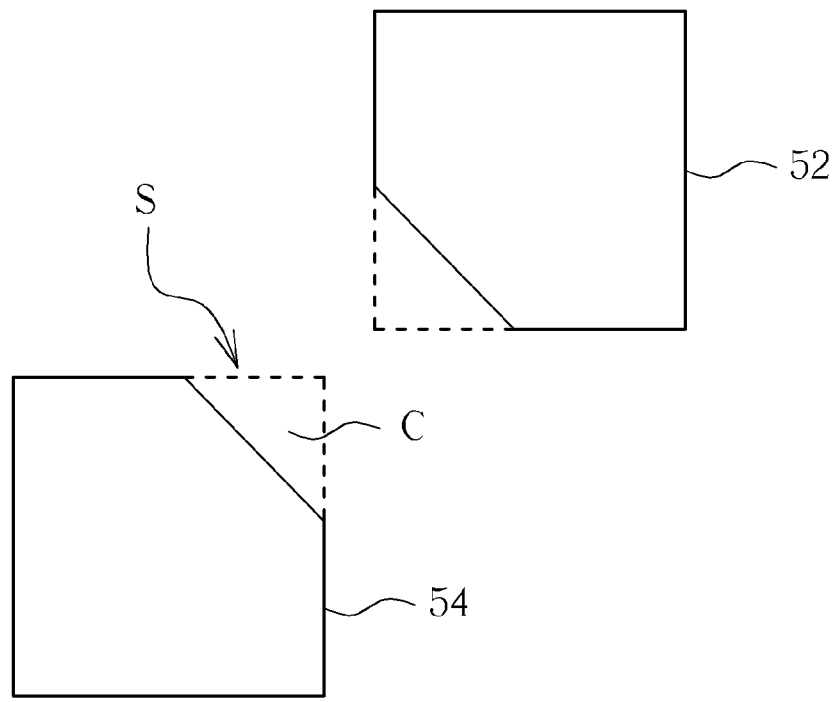
FIG. 4 is a diagram showing the via patterns of the double patterning technique having truncated corners.

Please refer to FIG. 4, which is a diagram showing the via patterns of the double patterning technique having truncated corners. In order to prevent light interference due to the corners of the via patterns being too close to each other, the present invention provides a first via pattern 52 having a truncated corner C, and a second via pattern 54 having a truncated corner C. The truncated corners C of the two via patterns 52, 54, which are arranged along a diagonal direction, are the closest corners between the two via patterns 52, 54. Therefore, a gap between the first via pattern and the second via pattern is enlarged.

A length of a cutting side S of the truncated corner C is between half width of the via pattern and 1/20 width of the via pattern. And, the length of the cutting side S of the truncated corner C is preferably between 1/5 width of the via pattern and 1/10 width of the via pattern.

Figure 5:
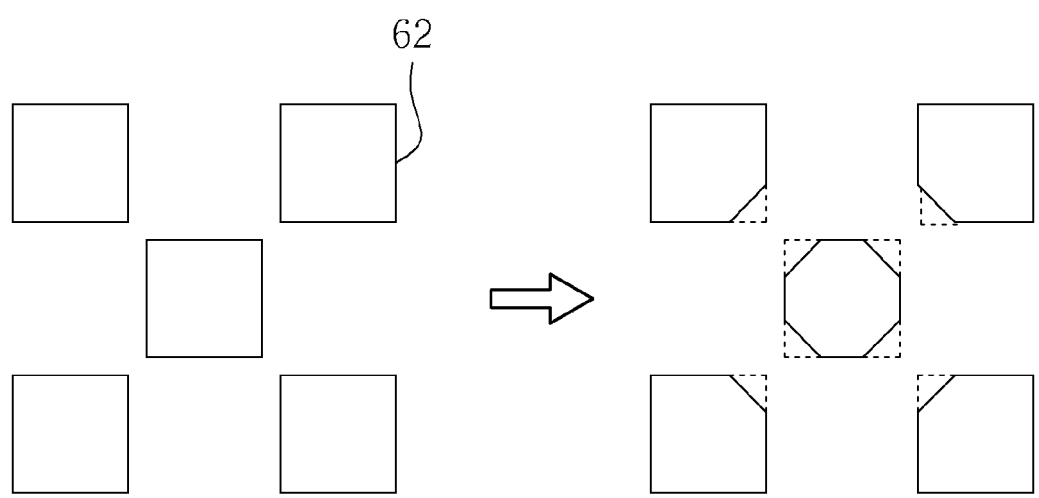
FIG. 5 is a diagram showing via patterns before and after modification.

Please refer to FIG. 5, which is a diagram showing via patterns before and after modification. As shown in FIG. 5, the via pattern 62 may have one truncated corner, or the via pattern 62 may have four truncated corners. The present invention can determine number of truncated corners of the via pattern according to distance between the via patterns.

Figure 6:
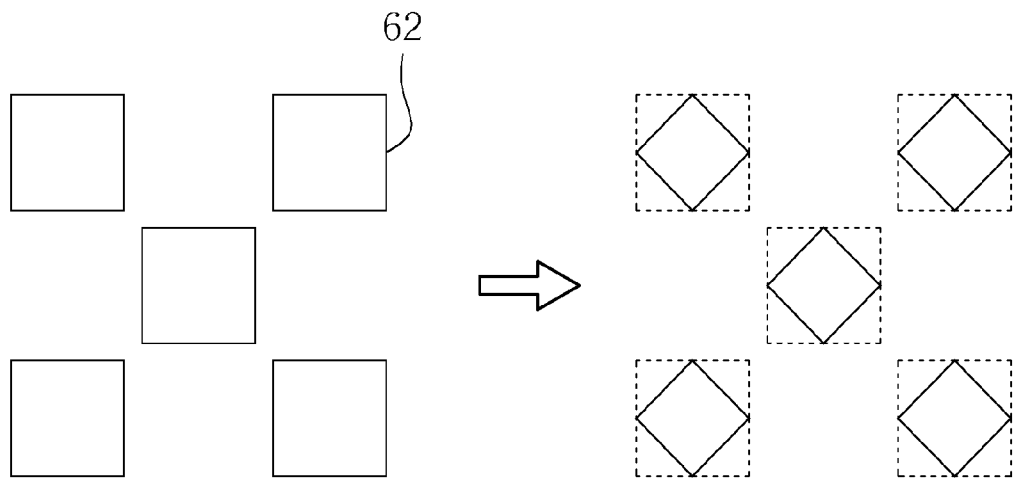
FIG. 6 is a diagram showing via patterns having largest truncated corners.

Please refer to FIG. 6, which is a diagram showing via patterns having largest truncated corners. As shown in FIG. 6, when each of the via patterns 62 has four truncated corners, and the length of the cutting side of the truncated corner is equal to half width of the via pattern 62, the modified via patterns become rhombus shaped. The above arrangement is different from simply rotating the via patterns 32 of FIG. 3 at a 45 degree angle. For example, if the via patterns 32 are simply rotated by 45 degrees, a distance between a vertex and a center of the via pattern is $\sqrt{2}$ times of a distance between a side line and the center of the via pattern, and because $\sqrt{2}$ is not a rational number, the vertex of the via patterns 32 will be shifted, such that the via patterns 32 are deformed. The modified via patterns of FIG. 6 do not have the deformation problem.

In addition, the present invention can perform optical proximity correction on the modified via patterns for developing patterns correctly on the wafer. The present invention can utilize pre-built optical models to perform optical proximity correction on the modified via patterns.

Figure 7:
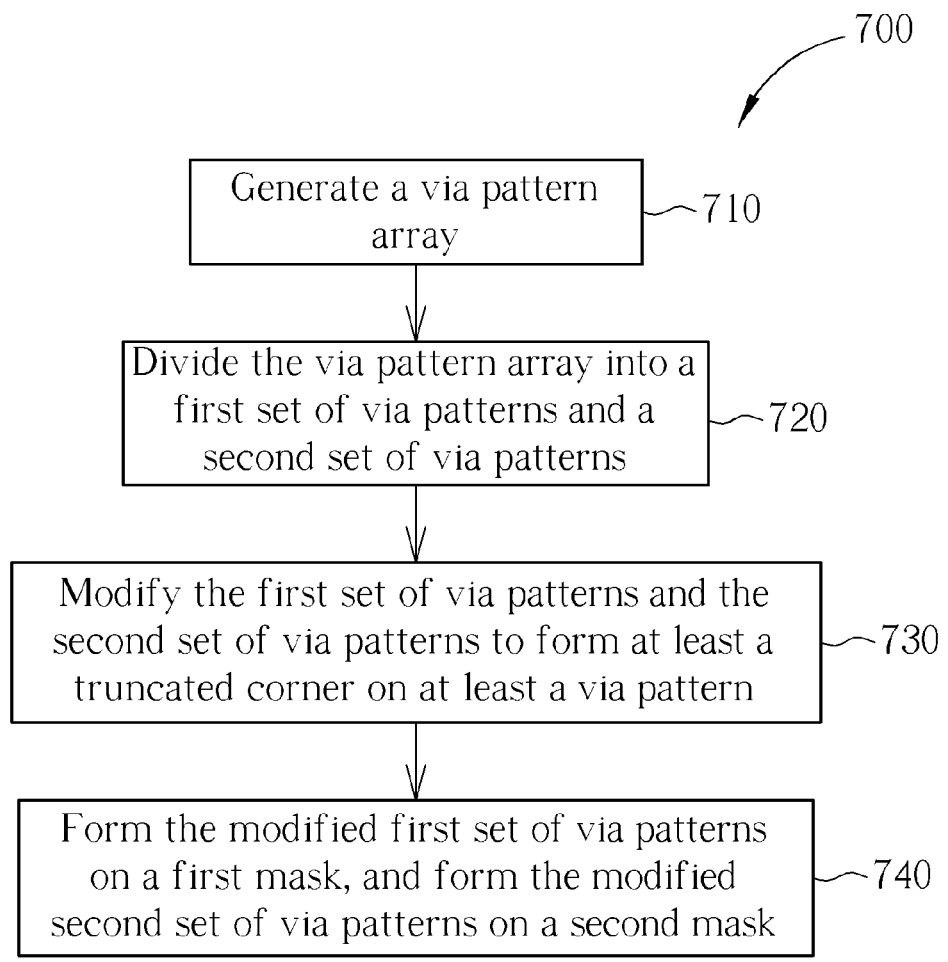
FIG. 7 is a flow chart of the method of the present invention for forming a double patterning mask set.

Please refer to FIG. 7, which is a flow chart 700 of the method of the present invention for forming a double patterning mask set. The flow chart 700 comprises the following steps:

Step 710: Generate a via pattern array;

Step 720: Divide the via pattern array into a first set of via patterns and a second set of via patterns, wherein the first set of via patterns and the second set of via patterns are interlacedly arranged along a horizontal direction and a vertical direction, and are complementary to each other to form the via pattern array;

Step 730: Modify the first set of via patterns and the second set of via patterns to form at least a truncated corner on at least a via pattern; and Step 740: Form the modified first set of via patterns on a first mask, and form the modified second set of via patterns on a second mask.

Basically, to achieve the same result, the steps of the flowchart 700 need not be in the exact order shown and need not be contiguous. That is, other steps can be inserted between, such as optionally performing optical proximity correction on the modified first set of via patterns and the modified second set of via patterns.

In contrast to the prior art, the via patterns of the double patterning mask of the present invention comprise truncated corners for increasing gap between via patterns in order to solve the problem of incorrectly developed patterns on the wafer caused by light interference due to insufficient gap between via patterns. The current exposure machine becomes useful in the manufacturing processes of the integrated circuit having smaller scale by utilizing the double patterning mask of the present invention.

Those skilled in the art will readily observe that numerous modifications and alterations of the device and method may be made while retaining the teachings of the invention.

What is claimed is:

1. A double patterning mask set, comprising:
   a first mask having a first set of via patterns, the first set of via patterns comprising at least two via patterns arranged along a diagonal direction, each of the two via patterns having at least a truncated corner;
   a second mask having a second set of via patterns, wherein the first set of via patterns and the second set of via patterns are interlacedly arranged along a horizontal direction and a vertical direction.

2. The mask set of claim 1, wherein the truncated corners of the two via patterns are the closest corners between the two via patterns.

3. The mask set of claim 1, wherein a length of a cutting side of the truncated corner is between half width of the via pattern and $\frac{1}{20}$ width of the via pattern.

4. The mask set of claim 3, wherein the length of the cutting side of the truncated corner is between $\frac{1}{5}$ width of the via pattern and $\frac{1}{10}$ width of the via pattern.

5. A method for forming semiconductors on a wafer by utilizing a double patterning mask set, the method comprising:
   providing a double patterning mask set having a first mask with a first set of via patterns and a second mask with a second set of via patterns, the first set of via patterns and the second set of via patterns interlacedly arranged along a horizontal direction and a vertical direction, and at least one of the sets of via patterns comprising a via pattern with a truncated corner;
   utilizing the first mask to expose the wafer; and
   utilizing the second mask to expose the wafer.

6. A method for forming a double patterning mask set, the method comprising:
   generating a via pattern array;
   dividing the via pattern array into a first set of via patterns and a second set of via patterns, wherein the first set of via patterns and the second set of via patterns are interlacedly arranged along a horizontal direction and a vertical direction, and are complementary to each other to form the via pattern array;
   modifying the first set of via patterns and the second set of via patterns to form at least a truncated corner on at least a via pattern; and
   forming the modified first set of via patterns on a first mask, and forming the modified second set of via patterns on a second mask.

7. The method of claim 6, further comprising performing optical proximity correction on the modified first set of via patterns and the modified second set of via patterns.

8. The method of claim 7, wherein performing optical proximity correction on the modified first set of via patterns and the modified second set of via patterns is performing optical proximity correction on the modified first set of via patterns and the modified second set of via patterns by utilizing optical models.

9. The method of claim 6, wherein a length of a cutting side of the truncated corner is between half width of the via pattern and $\frac{1}{20}$ width of the via pattern.

10. The method of claim 9, wherein the length of the cutting side of the truncated corner is between $\frac{1}{5}$ width of the via pattern and $\frac{1}{10}$ width of the via pattern.

* * * * *